(12) United States Patent
Tamagawa

(10) Patent No.: US 9,323,660 B2
(45) Date of Patent: Apr. 26, 2016

(54) MEMORY ACCESS CONTROL APPARATUS AND MEMORY ACCESS CONTROL METHOD

(71) Applicant: MegaChips Corporation, Osaka (JP)

(72) Inventor: Yuko Tamagawa, Osaka (JP)

(73) Assignee: MegaChips Corporation, Osaka-shi (JP)

(*) Notice: Subject to any disclaimer, the term of this patent is extended or adjusted under 35 U.S.C. 154(b) by 738 days.

(21) Appl. No.: 13/684,823

(22) Filed: Nov. 26, 2012

(65) Prior Publication Data

US 2013/0145082 A1 Jun. 6, 2013

(30) Foreign Application Priority Data

Dec. 2, 2011 (JP) ................................. 2011-264723

(51) Int. Cl.
  *G06F 12/00* (2006.01)
  *G06F 12/02* (2006.01)
  *G06F 3/06* (2006.01)
  *G11C 16/34* (2006.01)

(52) U.S. Cl.
  CPC .............. *G06F 12/0246* (2013.01); *G06F 3/06* (2013.01); *G06F 3/0604* (2013.01); *G06F 12/00* (2013.01); *G11C 16/3427* (2013.01)

(58) Field of Classification Search
  None
  See application file for complete search history.

(56) References Cited

U.S. PATENT DOCUMENTS 9,053,808 B2 * 6/2015 Sprouse ............. G11C 16/3418
2011/0119431 A1 5/2011 Chowdhury

FOREIGN PATENT DOCUMENTS

| JP | 2008-90778 | 4/2008 |
| JP | 2008-293579 | 12/2008 |
| JP | 2009-26285 | 2/2009 |
| JP | 2011-107851 | 6/2011 |

* cited by examiner

*Primary Examiner* — Midys Rojas
(74) *Attorney, Agent, or Firm* — Oblon, McClelland, Maier & Neustadt, L.L.P.

(57) ABSTRACT

A memory is readable by page and erasable by block including a plurality of pages. After a read request to the memory is issued, a memory controller specifies all blocks which can be accessed based on an address specified by a read command, as candidate blocks, and specifies an inspection target page out of pages included in the candidate blocks on the basis of a predetermined rule. The memory controller inspects whether or not there is an error in the inspection target page.

13 Claims, 4 Drawing Sheets

MEMORY ACCESS CONTROL APPARATUS AND MEMORY ACCESS CONTROL METHOD

BACKGROUND OF THE INVENTION

1. Field of the Invention

The present invention relates to a technique to cope with a read disturb phenomenon in which data is unintentionally rewritten by repeatedly reading the data out from a flash memory.

2. Description of the Background Art

NAND flash memories are rewritable nonvolatile semiconductor memories. The NAND flash memories can achieve high integration while ensuring cost reduction, and therefore are widely used in a form of SD memory card or the like.

In the NAND flash memories, it has been found that a phenomenon occurs in which stored data is unintentionally rewritten by repeatedly reading a specific cell. Such a phenomenon is termed a "read disturb phenomenon" and this is a problem in using the NAND flash memories.

Even if a specific cell is repeatedly read out, when data in a region including the cell is once updated, the cell is recovered to the original state and it is therefore possible to avoid any ill effect on information processing due to the read disturb phenomenon. In a case, however, where no write operation is performed on the specific cell and only read operation is repeatedly performed thereon, there is a strong possibility that the read disturb phenomenon may occur, and this may affect the information processing.

The NAND flash memories have been used recently as program memories, like ROMs, of information processing apparatuses in more cases. In the case where a NAND flash memory is used in such a manner, there is an increased possibility that the read disturb phenomenon may occur since only read operation is continuously performed.

Some measures are taken in order to avoid occurrence of the read disturb phenomenon or recover the error caused by the read disturb phenomenon. For example, used is a method in which data in each page of a NAND flash memory is read by using a predetermined algorithm and then error detection is performed by using an error checking and correction circuit. If data having an error is detected by the error checking and correction circuit, the data is corrected and then rewritten into the memory. This can recover the cell in which the read disturb phenomenon occurs.

Various algorithms can be used to detect errors. For example, there is a method of sequentially checking all the pages in the NAND flash memory. In the case of adopting the method of sequentially checking all the pages, unnecessary inspection is performed even on pages having a low possibility of occurrence of error. On the other hand, the inspection frequency for pages having a strong possibility of occurrence of error is reduced. As a result, this becomes a factor of reducing the reliability of error detection.

Though a method of checking pages in a NAND flash memory at random is also used, it is still impossible, by this method, to ensure efficient inspection on pages having a strong possibility of occurrence of error.

Further, used is a method of performing error detection on blocks whose read count is high. The case of adopting this method requires enough storage capacity to store read counts for all the blocks. As the capacity of the NAND flash memory increases, there arises a problem of requiring too much storage capacity in order to store the read count for each block.

Japanese Patent Application Laid Open Gazette No. 2011-107851 discloses a technique to prevent the read disturb phenomenon. In the technique disclosed in Japanese Patent Application Laid Open Gazette No. 2011-107851, an inspection target page is specified without holding the read count for each block. In this technique, however, since all the pages are evenly checked, it is still impossible to ensure efficient inspection on pages having a strong possibility of occurrence of error.

SUMMARY OF THE INVENTION

The present invention is intended for a memory access control apparatus for controlling access to a rewritable nonvolatile semiconductor memory which is readable by page and erasable by block including a plurality of pages. According to the present invention, the memory access control apparatus comprises a specifying part for specifying an inspection target page after a read request to the nonvolatile semiconductor memory is issued and an inspection part for inspecting whether or not there is an error in the inspection target page, and in the memory access control apparatus of the present invention, the specifying part includes a candidate specifying part for specifying all blocks which can be accessed based on an address specified by a read command, as candidate blocks and a page specifying part for specifying the inspection target page out of pages included in the candidate blocks on the basis of a predetermined rule.

By the memory access control apparatus according to the present invention, it is possible to efficiently detect occurrence of a read disturb in the rewritable semiconductor memory and prevent any ill effect on information processing before happens.

The present invention is also intended for a memory access control method for controlling access to a rewritable nonvolatile semiconductor memory which is readable by page and erasable by block including a plurality of pages. According to the present invention, the memory access control method comprises a specification step of specifying an inspection target page after a read request to the nonvolatile semiconductor memory is issued and an inspection step of inspecting whether or not there is an error in the inspection target page, and in the memory access control method of the present invention, the specification step includes a candidate specification step of specifying all blocks which can be accessed based on an address specified by a read command, as candidate blocks and a page specification step of specifying the inspection target page out of pages included in the candidate blocks on the basis of a predetermined rule.

It is an object of the present invention to provide an efficient technique to cope with the read disturb phenomenon.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
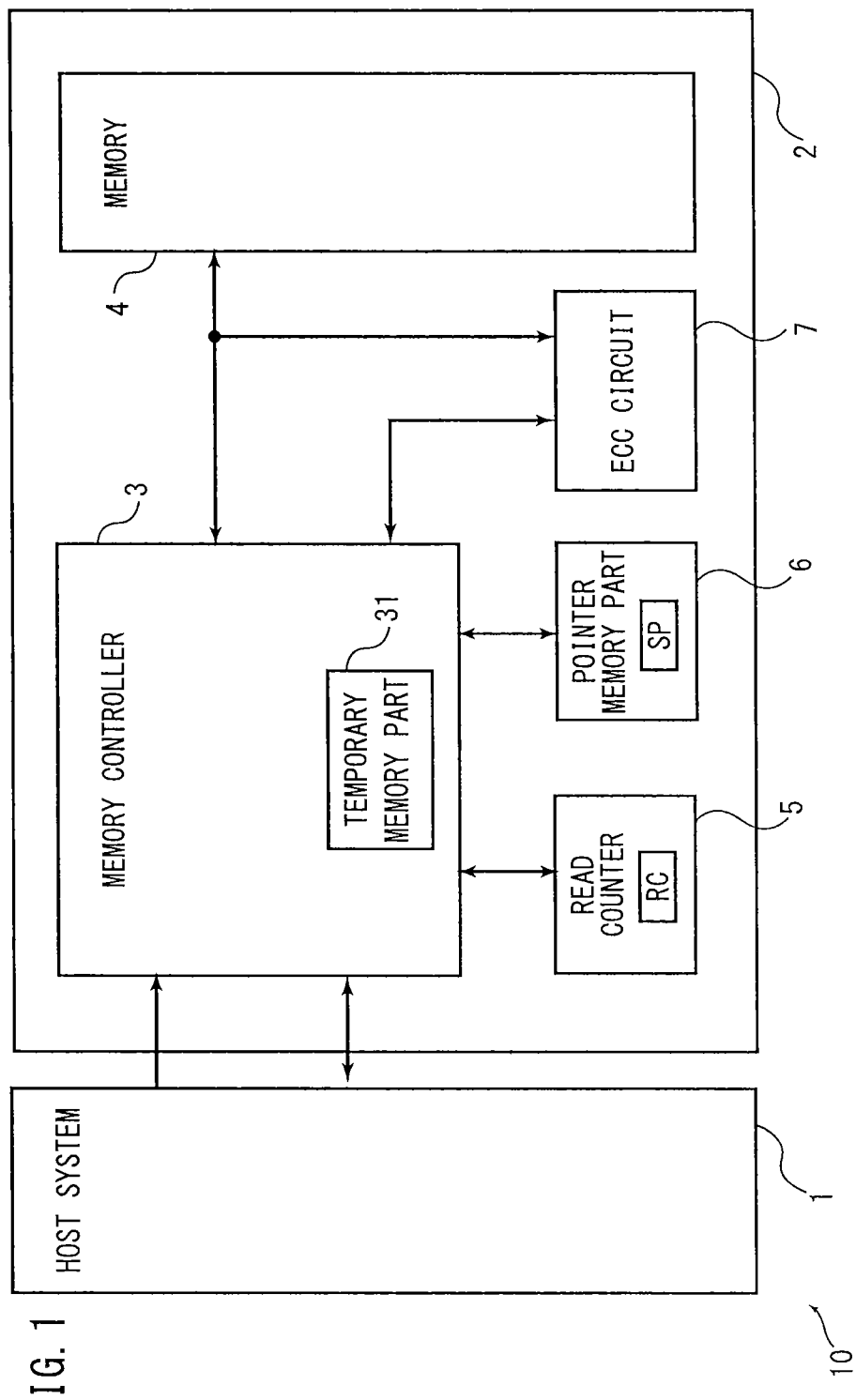
FIG. 1 is a block diagram showing an information processing system in accordance with a preferred embodiment of the present invention.

Hereinafter, with reference to figures, the preferred embodiments of the present invention will be discussed. FIG.

1 is a functional block diagram showing an information processing system 10 in accordance with the present preferred embodiment of the present invention. The information processing system 10 comprises a host system 1 and a memory module 2. The memory module 2 comprises a memory controller 3, a memory 4, a read counter 5, a pointer memory part 6, and an ECC (Error Checking and Correction) circuit 7.

The memory 4 is a rewritable nonvolatile semiconductor memory. In the present preferred embodiment, the memory 4 is a NAND flash memory. The memory controller 3 controls reading and writing of data from/to the memory 4. The information processing system 10 serves as, for example, a cellular phone device. In such a case, the host system 1 is a cellular phone device body and the memory module 2 is a memory card. The memory module 2 may be detachable from the host system 1 or may be integrated in a constituent device of the host system 1.

In the present preferred embodiment, the memory module 2 is equipped with the memory controller 3, but there may be a constitution where the host system 1 is equipped with the memory controller 3. The error checking and correction circuit 7 may be provided in the memory 4 or provided in the memory controller 3.

Figure 2:
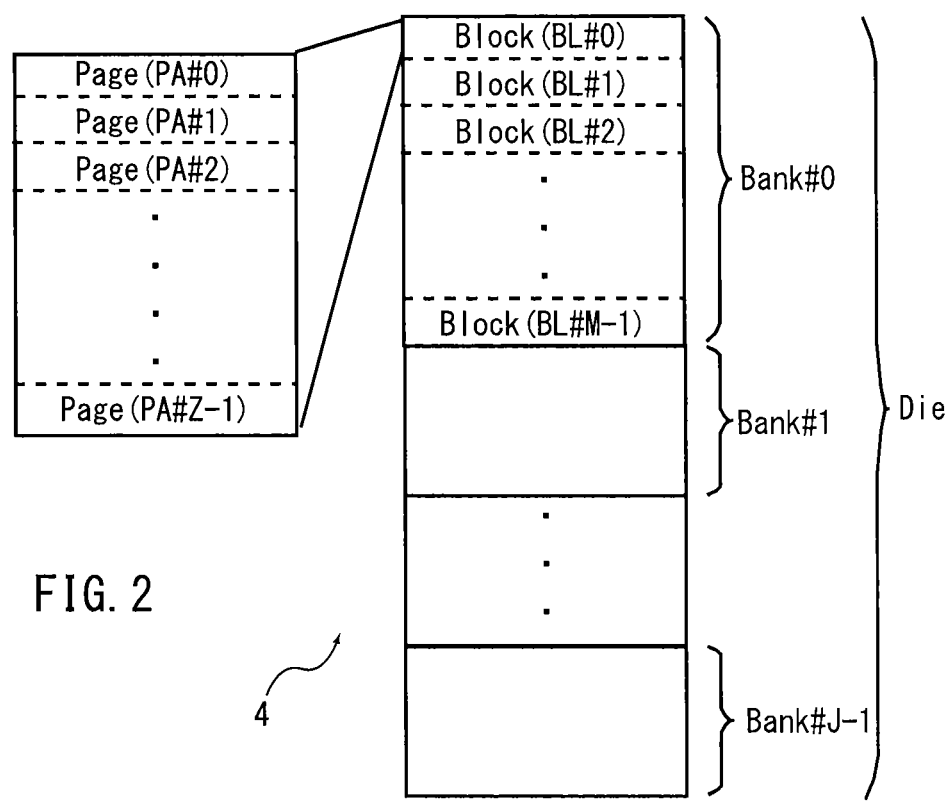
FIG. 2 is a diagram showing a memory configuration of a NAND flash memory.

FIG. 2 is a diagram showing a configuration of the memory 4. The memory 4 is formed of one die. A die includes a plurality of banks. In the exemplary configuration of FIG. 2, one die includes J banks. A bank includes a plurality of blocks. In the exemplary configuration of FIG. 2, one bank includes M blocks. Further, a block includes a plurality of pages. In the exemplary configuration of FIG. 2, one block includes Z pages.

A page is a unit of read operation on the memory 4. The memory controller 3 can read data stored in the memory 4 by page. A block is a unit of erase operation on the memory 4. The memory controller 3 can erase data stored in the memory 4 by block.

A block in the memory 4 consists of a plurality of pages which physically adjoin one another. For example, a block consists of a plurality of pages which are adjoiningly arranged in order of memory address. Therefore, when a read operation is repeatedly performed on a specific page in a block, a load is imposed on surrounding pages in the same block and there is a possibility that a read disturb phenomenon may occur in the surrounding pages. A bank in the memory 4 consists of a plurality of blocks which logically adjoin one another. The blocks constituting a bank may physically adjoin one another.

Referring again to FIG. 1, the read counter 5 counts up the number of read accesses to the memory 4. As discussed above, the memory controller 3 performs a read operation on the memory 4 by page. When the memory controller 3 performs a read operation on the memory 4, the memory controller 3 gives information specifying a page on which the read operation is performed, to the read counter 5. Specifically, the memory controller 3 gives a bank No., a block No., and a page address of the page on which the read operation is performed, to the read counter 5.

Though the read counter 5 acquires the bank No., the block No., and the page address of the read target page from the memory controller 3, the read counter 5 does not count up the number of read accesses by page but counts up the number of read accesses by block. In other words, the read counter 5 counts up the number of read accesses to each block without distinction of which page in the block the read access is made to. The read counter 5 holds a plurality of read counts RC corresponding to the number of blocks.

The pointer memory part 6 stores a pointer SP for each page. The pointer SP is data for specifying an inspection target page. The pointer memory part 6 manages the pointer SP for each block. In other words, the pointer memory part 6 holds a plurality of pointers SP corresponding to the number of blocks.

The read counter 5 and the pointer memory part 6 have only to store the read counts RC and the pointers SP, respectively, during the period while the power of the information processing system 10 is ON. Therefore, in the present preferred embodiment, volatile memories may be used as the read counter 5 and the pointer memory part 6.

The read counter 5 counts up the read count for each block from the time when the information processing system 10 is powered on. In other words, when the information processing system 10 is powered off, the read count which has been counted up until then is not held. At the point in time when the information processing system 10 is powered off, the read counts RC for all the blocks are canceled. In the read counter 5, the read counts RC are counted up from the point in time when the information processing system 10 is powered on.

The pointer memory part 6 sets the pointer SP to an initial position when the information processing system 10 is powered on. The initial position is determined in accordance with a predetermined rule. For example, the first page in a block is set as the initial position. The pointer memory part 6 does not have to hold the pointers SP which have been held at that point when the information processing system 10 is powered off. Every time when the information processing system 10 is powered on, the pointer SP is set to the initial position.

The error checking and correction circuit 7 (hereinafter, referred to as the "ECC circuit 7") detects that wrong data is recorded in the memory 4 and corrects the wrong data.

Figure 3:
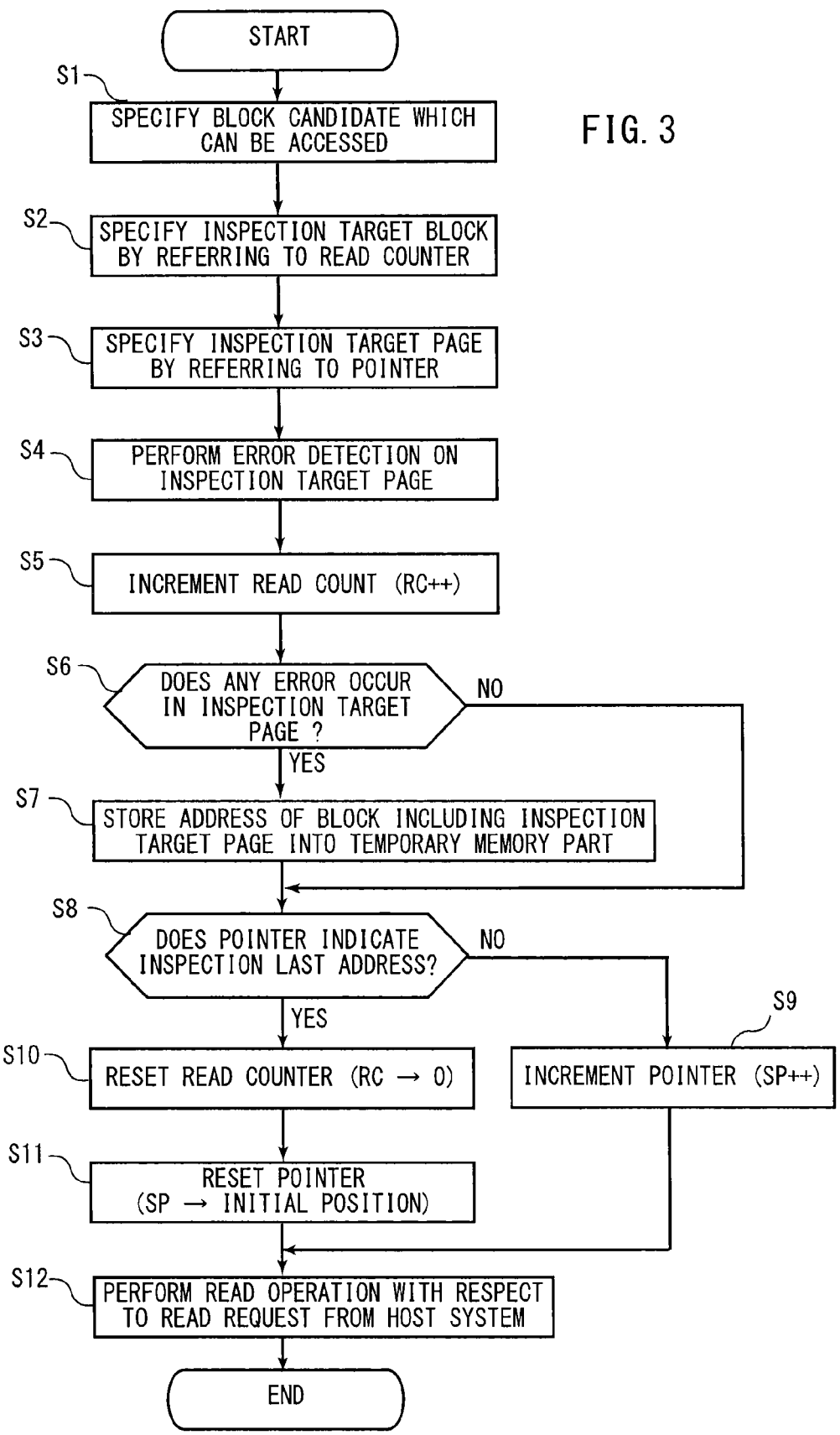
FIG. 3 is a flowchart of control operation in accordance with the preferred embodiment.

Next, discussion will be made on a control operation in accordance with the present preferred embodiment. FIG. 3 is a flowchart of control operation performed in the memory controller 3 or the ECC circuit 7.

As discussed with reference to the flowchart of FIG. 3, in the present preferred embodiment, when a read command is issued to the memory 4 from the host system 1, an operation of specifying an inspection target page is performed before the read operation on the memory 4 is performed. Further, in the present preferred embodiment, an error detection operation on the inspection target page is performed before the read operation on the memory 4 is performed.

The memory controller 3 first specifies a block candidate which has a possibility of being accessed (Step S1). In order to specify the block candidate, the memory controller 3 acquires a read address from the read command given by the host system 1. The memory controller 3 generates a read page address of the memory 4 which is a NAND flash memory from the acquired read address.

The memory controller 3 and the memory 4 of the present preferred embodiment can continuously read a plurality of pages with respect to one read command. The host system 1 sends a read enable signal while giving a read address to the memory controller 3. While the memory controller 3 receives the read enable signal, the memory controller 3 continuously performs a read operation on a plurality of pages by incrementing the address of the read page by one page. For example, the memory controller 3 continuously reads a plurality of pages by incrementing the address of the read page by one byte.

In the memory controller 3, however, the maximum number of pages which can be continuously read is set in advance. Therefore, the memory controller 3 can specify a block which can be accessed by this read operation from the read address included in the read command given by the host system 1 and the maximum number of pages which is held in advance. The memory controller 3 specifies all the blocks which can be accessed, as candidate blocks.

Next, the memory controller 3 accesses the read counter 5, to thereby acquire the read count RC for each candidate block. The memory controller 3 specifies a block whose read count RC is the highest among the candidate blocks, as an inspection target block (Step S2). In the present preferred embodiment, however, a threshold value RCth of the read count is set. Though the memory controller 3 specifies a block whose read count RC is the highest among the candidate blocks, if the read count RC is less than the threshold value RCth, the block is not selected as the inspection target block. In such a case, the flowchart of FIG. 3 is finished.

Subsequently, the memory controller 3 accesses the pointer memory part 6, to thereby acquire the pointer SP of the block which is specified as the inspection target block. The memory controller 3 specifies a page which is indicated by the pointer SP, out of the pages includes in the inspection target block, as an inspection target page (Step S3).

Figure 4:
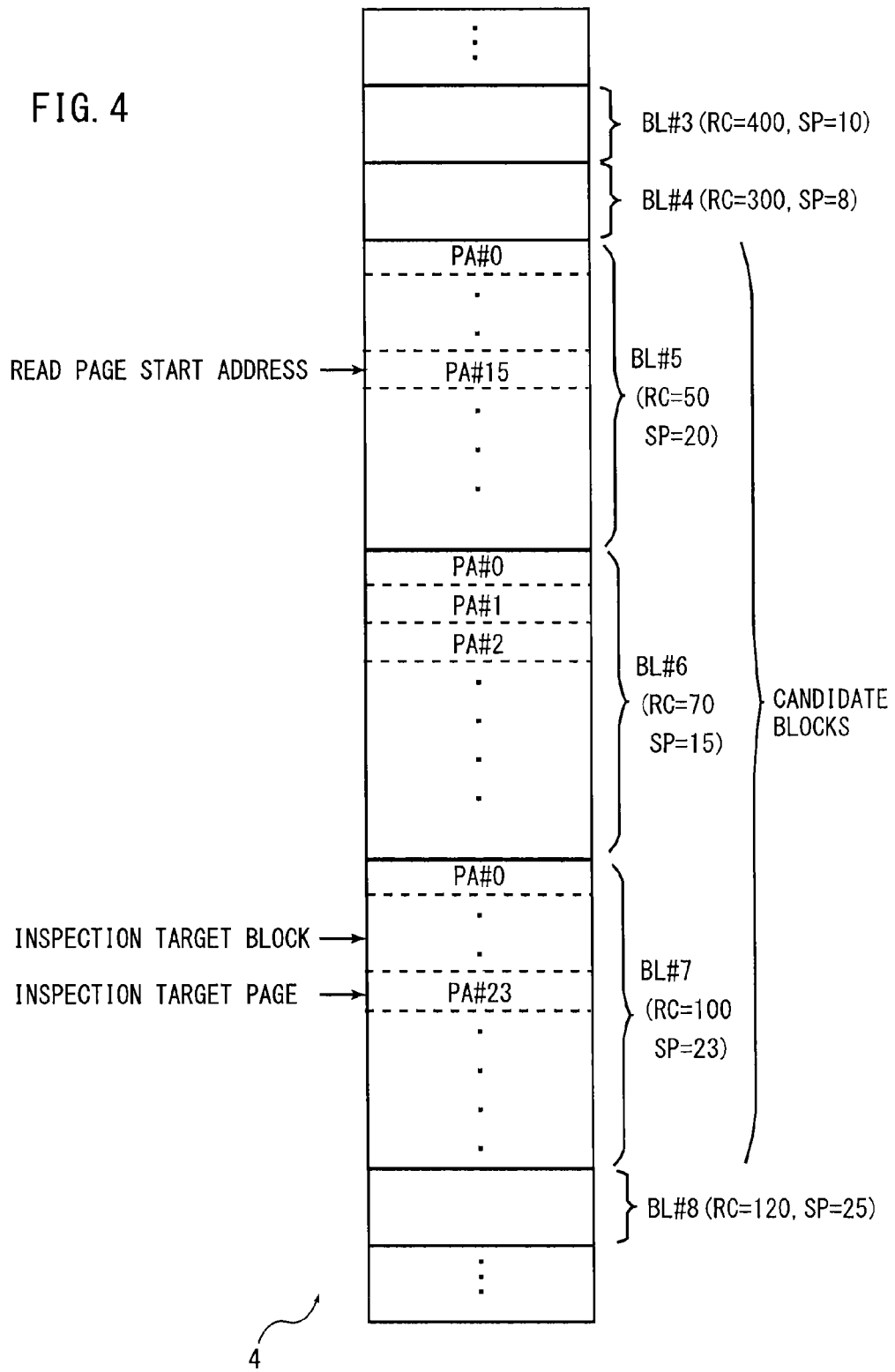
FIG. 4 is a view showing a method of specifying an inspection target page.

FIG. 4 is a view showing a method of specifying the candidate block, the inspection target block, and the inspection target page. In FIG. 4, it is assumed that the read address specified by the host system 1 corresponds to the page PA#15 in the block BL#5. Further, it is assumed that the blocks BL#5 to BL#7 are specified as the blocks which can be accessed on the basis of the maximum number of read pages. In other words, the blocks BL#5 to BL#7 are the candidate blocks. As shown in FIG. 4, the read counts RC of the blocks BL#5, BL#6, and BL#7 are 50, 70, and 100, respectively. Therefore, the block BL#7 is specified as the inspection target block. It is assumed herein that the read count RC=100 is larger than the threshold value RCth. Then, the pointer SP which is held at this point in time with respect to the block BL#7 is 23, as shown in FIG. 4. Therefore, the page PA#23 in the block BL#7 is specified as the inspection target page.

The memory controller 3 reads the inspection target page and gives data and syndrome of the inspection target page to the ECC circuit 7. The ECC circuit 7 performs an error detection operation on the inspection target page (Step S4). In this case, since a read operation is performed on the inspection target page, the read count RC of the inspection target block is incremented by 1 (Step S5).

When it is found, as the result of the error detection performed by the ECC circuit 7, that there occurs an error in the inspection target page ("YES" in Step S6), the memory controller 3 stores the address of the block including the page specified as the inspection target page into a temporary memory part 31 which the memory controller 3 has (Step S7). As discussed later, the memory controller 3 reads the address stored in the temporary memory part 31 at another timing and performs an error correction operation on the data in the block corresponding to the address. The memory controller 3 writes the error-corrected data into a block which is physically different from the original block, to thereby perform a refresh operation on the memory 4. Further, there may be a case where the address of the inspection target page is stored in the temporary memory part 31 and the address is replaced with the block address when the error correction operation is performed.

In Step S7, after the address is stored into the temporary memory part 31, or when a determination of "NO" is made in Step S6, the process goes to Step S8. In Step S8, the memory controller 3 determines whether or not pointer SP of the inspection target page indicates an inspection last address.

Herein, discussion will be made on the inspection last address. As discussed earlier, the pointer memory part 6 sets the pointer SP of each block to the initial position when the information processing system 10 is powered on. If the initial position is the first page address in the block, the inspection last address is the last page address in the block. If the initial position is an address other than the first page address in the block, the inspection last address is an address immediately preceding the page address of the initial position. In any case, the inspection last address is the address which is specified last when the pointer SP covers all the pages in the block with the initial position as a start point thereof.

When the pointer SP of the inspection target page does not indicate the inspection last address ("NO" in Step S8), the memory controller 3 increments the pointer SP by one page (Step S9). Thus, by incrementing the pointer SP, different pages are sequentially specified as the inspection target page. In this case, when the pointer SP indicates the last page address in the block, the pointer SP goes back to the first page address in the block in Step S9.

When the pointer SP of the inspection target page indicates the inspection last address ("YES" in Step S8), the memory controller 3 resets the read count RC of the inspection target block to 0 (Step S10).

When the pointer SP of the inspection target page reaches the inspection last address, this means that all the pages in the inspection target block have been specified as the inspection target page. This means completion of the error inspection on all the pages in the inspection target block. Therefore, by resetting the read count RC to 0, the priority of the block for being specified next as the inspection target block is lowered. In Step S2 discussed above, in order to specify the inspection target block, the read count RC is compared with the threshold value RCth. Since the read count RC is reset to 0 in Step S10, this block is not specified as the inspection target block until the read count RC thereof next exceeds the threshold value RCth. It is thereby possible to prevent a block whose read count RC is high from being specified as the inspection target block too many times. Further, there may be a case where the read counts RC of all the blocks are set to the threshold value RCth after the information processing system 10 is powered on. In such a case, immediately after the power is turned on, all the blocks are likely to be specified as the inspection target block, and this can prevent any block from not being specified as the inspection target block for a long time after the power-on.

Subsequently, the memory controller 3 resets the pointer SP of the inspection target block to the initial position (Step S11). If the initial position is the first page address in the block, the pointer SP is set again to the first page address in the block. If the initial position is an address other than the first page address in the block, the pointer SP is set again to the address.

After Step S9 or Step S11 is finished, the memory controller 3 performs the read operation with respect to the read request given by the host system 1 (Step S12).

By performing the above process, the address of the block including the page in which some error is detected is stored in the temporary memory part 31. The memory controller 3 performs an error correction operation on the block at another timing. In the present preferred embodiment, the memory controller 3 reads all the pages in the block, performs error detection and correction thereon, and writes all the pages which do not include any error into a physically different block. At that time, since the read operation is performed on all the pages in the inspection target block, the read count RC of the inspection target block is incremented by the number of all the pages. As another method, the memory controller 3 reads all the pages in the block, performs the error detection and correction thereon, and once writes all the pages which do not include any error into a provisional block. Further, the memory controller 3 reads all the pages in the provisional block, performs the error detection and correction thereon, and writes all the pages which do not include any error into the original block. At that time, since the read operation is performed twice on all the pages in the inspection target block, the read count RC of the inspection target block is incremented by twice the number of all the pages. Further, in Step S12, a normal read operation is performed on the page data, and the read count RC of the block including the read page is incremented by 1 also in this case.

Thus, in the information processing system 10 of the present preferred embodiment, when a read request is issued from the host system 1, a block whose read count RC is the highest among the blocks which can be accessed is specified as the inspection target block. It is thereby possible to narrow the inspection target to blocks which are accessed with high frequency and avoid unnecessary inspection. In a case where an application program is stored in the memory 4 and the memory 4 is used like a ROM, for example, there is a strong possibility that a specific region is accessed many times by executing the application. In such a case, in the present preferred embodiment, it is possible to perform error check while giving priority to a region having a strong possibility of having an error, in the accessed region.

Conventionally, the method of performing error check on the pages in the memory at random, the method of performing error check on all the pages in the memory, and the like have been adopted. In a case of adopting one of these methods, the error detection is performed on unnecessary regions while the error inspection is not sufficiently performed on regions having a strong possibility of having errors. On the other hand, in the present preferred embodiment, by narrowing the inspection target to blocks having a possibility of being accessed, it is possible to perform error inspection while giving priority to regions having a strong possibility of being accessed. Further, since priority for becoming the inspection target is given to blocks whose read count is high, it is possible to ensure efficient error detection.

In the present preferred embodiment, only one page in a block having a possibility of being accessed to be read is specified as the inspection target and the only one page becomes a target for the error detection. Therefore, it is possible to prevent larger load from being imposed on the memory 4 through the error detection operation.

Further, in the present preferred embodiment, the read count RC for each block and the pointer SP for each block are held during the period while the power of the information processing system 10 is ON. In other words, during the period while the power of the information processing system 10 is OFF, it is not necessary to hold the information on the read count RC and the pointer SP. This eliminates the necessity of providing a nonvolatile memory to hold the information on the read count RC and the pointer SP. Even in a case where any trouble occurs, such as a case where the information processing system 10 is unintentionally powered off, no effect is produced on the operation of specifying the inspection target. Further, when the read count RC and the pointer SP are stored in a nonvolatile memory, a circuit for coping with the case where such unintentional power-off occurs is needed. In the present preferred embodiment, it is not necessary to provide such a circuit for coping with any trouble, and therefore the circuit scale can be reduced.

In the present preferred embodiment, the reason why it is not necessary to store the read count RC in a nonvolatile memory is as follows. In the present preferred embodiment, the read count RC is used to specify the inspection target block, but the blocks have only to be relatively compared in the read count RC with one another. It is not necessary to strictly manage the value of the read count RC. It is sufficient to specify a block whose read count RC is relatively higher than those of the other blocks after the power-on.

In the present preferred embodiment, the reason why it is not necessary to store the pointer SP in a nonvolatile memory is as follows. In a case where read access is repeatedly made to a specific region in the memory 4 many times, with respect to the region to which read access is repeatedly made after the power-on until the power-off, there is a strong possibility that all the pages in the block may become inspection targets. Therefore, when the power is turned on again, there is no problem only if the inspection target is returned to the initial position. Further, the read disturb phenomenon is a stress in which a load is imposed evenly on all the pages in the block. For example, by moving the initial position of the pointer SP from the preceding initial position every time when the power is turned on, it is possible to prevent only a specific page from being repeatedly specified as inspection target.

Other Preferred Embodiments

In the above-discussed preferred embodiment, when a read command is issued to the memory 4 from the host system 1, the inspection target page is specified and the error detection operation on the inspection target page is performed before the read operation on the memory 4 is performed. As another preferred embodiment, the operation of specifying the inspection target page and the error detection operation on the inspection target page may be performed at a predetermined timing after the read operation on the memory 4 is performed. For example, after the read operation on the memory 4 is performed, the operation of specifying the inspection target page and the error detection operation may be performed at a timing where the host system 1 does not access the memory 4. In this case, when the operation of specifying the inspection target is performed, since a certain region has already been accessed, a block whose read count RC is the highest among the blocks which have been accessed is specified as the inspection target block. It is thereby possible to narrow the inspection target to the block which is accessed with high frequency and avoid unnecessary inspection. Further, it is possible to perform error check while giving priority to a region having a strong possibility of having an error, in the accessed block.

As discussed above, the memory controller 3 performs a refresh operation on the address stored in the temporary memory part 31 at another timing. In other words, the memory controller 3 reads all the pages in the inspection target block on the basis of the address stored in the temporary memory part 31 and performs the error correction operation. After performing the error correction operation on the inspection target block, the memory controller 3 writes the corrected data back into the memory 4. Since the NAND flash memory is erasable only by block, when the data in the inspection target page is written back, the data in the inspection target block is once erased and the data in all the pages in the block are rewritten. Accordingly, the refresh operation is performed not only on the inspection target page but also on the whole block including the inspection target page. Therefore, after the error correction is performed on the inspection target block, the read count RC of the block including the inspection target page is reset to 0. Further, after the error correction is performed on the inspection target block, the pointer SP of the inspection target block may be reset to the initial position.

In the above-discussed preferred embodiment, when a read operation is performed on a page in a block, the read count RC of the block is incremented by 1. When the first page or the last page in the block is read, the read count RC may be incremented by 2 or more than 2. This is because it is found that there is a strong possibility that the read disturb phenomenon may occur in both the end pages (the first and last pages) in a block because of the structure of the NAND flash memory.

In the above-discussed preferred embodiment, when a memory region which can be accessed lies astride a plurality of blocks, a block whose read count RC is the highest among the blocks is specified as the inspection target. In other words, a block whose read count RC is the highest among the candidate blocks is specified as the inspection target. As another preferred embodiment, all the candidate blocks may be specified as the inspection target. In this case, by referring to the pointer SP of each inspection target block, the inspection target page in each inspection target block is specified.

In the above-discussed preferred embodiment, a memory region which can be accessed is specified as the candidate block and the inspection target page is specified in the candidate block. As another preferred embodiment, in the case where the inspection target is specified after the normal read operation on the memory 4 is completed, the inspection target block may be specified out of the blocks which have been actually accessed to be read. When the region which has been actually accessed to be read lies astride a plurality of blocks, a block whose read count RC is higher among the end blocks may be specified as the inspection target, or both the end blocks may be specified as the inspection targets. This is because the normal read operation is inevitably performed on the blocks sandwiched between the end blocks and therefore error inspection is inevitably performed thereon.

In the above-discussed preferred embodiment, when a memory region which can be accessed lies astride a plurality of blocks, a block whose read count RC is the highest among the candidate blocks is specified as the inspection target. As another preferred embodiment, a block whose pointer SP indicates the smallest value among the candidate blocks may be specified as the inspection target. Herein, when the pointer SP indicates the smallest value, this means that the movement of the pointer SP from the initial position is the smallest. By this method, it is possible to prevent only some blocks from being specified as the inspection targets.

In the above-discussed preferred embodiment, the read count RC and the pointer SP are managed by block. As another preferred embodiment, one read count RC and one pointer SP are managed for a plurality of blocs. In this case, the pointer SP is managed so as to move astride a plurality of blocks.

In the above-discussed preferred embodiment, the pointer SP is moved by incrementing the address by page. As another preferred embodiment, the pointer SP may be moved by decrementing the address by page.

In the above-discussed preferred embodiment, a page which is indicated by the pointer SP in the inspection target block is specified as the inspection target. As another preferred embodiment, when the inspection target page is included in a block which is actually accessed, the specified inspection target page may be excluded from the inspection target. This is because the inspection target page is normally read as read data even without being specified as the inspection target. Also in the normal read operation, the error check is performed, and if there occurs an error, the address thereof may be stored into the temporary memory part 31. This method can be adopted, however, only when a block which has been actually accessed can be specified. In other words, this method can be adopted only when the inspection target page is specified after the read operation for data is performed. Further, in the case where the inspection target page is excluded from the inspection target, the pointer SP may be incremented.

In the above-discussed preferred embodiment, a page which is indicated by the pointer SP in the inspection target block is specified as the inspection target. As another preferred embodiment, if the inspection target page is included in a block which is accessed, another inspection target page may be selected from a block which is not accessed. This is because the inspection target page is normally read as read data even without being specified as the inspection target. This method can be adopted, however, only when a block which has been actually accessed can be specified. In other words, this method can be adopted only when the inspection target page is specified after the read operation for data is performed.

In the above-discussed preferred embodiment, the inspection target block is specified every time when a read request is issued from the host system 1. As another preferred embodiment, after the inspection target block is specified for one read request from the host system 1, the inspection target block may be fixed until all the pages in the inspection target block are inspected. In this case, only the pointer SP is moved every time when a read request is issued from the host system 1.

In the above-discussed preferred embodiment, it has been discussed that the pointer SP of each block is reset to the initial position when the information processing system 10 is powered on. As the initial position, the first page address in each block may be used. Alternatively, as the initial position, a page address in each block may be selected at random.

In the above-discussed preferred embodiment, a single inspection target page is specified in the inspection target block when a read request is issued from the host system 1. As another preferred embodiment, all the pages in the inspection target block may become the inspection targets.

In the above-discussed preferred embodiment, when some error is detected in the inspection target page, the address of the block including the inspection target page is stored into the temporary memory part 31. This means that the block including the inspection target page becomes a refresh target. In this case, the block including the inspection target page may be excluded from the inspection target until the refresh operation is completed. This is because the block is already determined to be refreshed.

In the above-discussed preferred embodiment, volatile storage parts are used as the read counter 5 and the pointer memory part 6. As another preferred embodiment, nonvolatile memories may be used as the read counter 5 and the pointer memory part 6.

While the invention has been shown and described in detail, the foregoing description is in all aspects illustrative and not restrictive. It is therefore understood that numerous modifications and variations can be devised without departing from the scope of the invention.

What is claimed is:

1. A memory access control apparatus for controlling access to a rewritable nonvolatile semiconductor memory which is readable by page and erasable by block including a plurality of pages, comprising:
    a read count memory configured to store a read count for said nonvolatile semiconductor memory by block;

a specifying part configured to specify an inspection target page after a read request to said nonvolatile semiconductor memory is issued; and an inspection part configured to inspect whether there is an error in said inspection target page, wherein said specifying part includes:

a candidate specifying part configured to specify all blocks which can be accessed based on an address specified by a read command, as candidate blocks;

a block specifying part configured to specify a block whose read count is the highest among said candidate blocks as an inspection target block by referring to said read count memory; and a page specifying part configured to specify said inspection target page out of said inspection target block on the basis of a predetermined rule.

2. The memory access control apparatus according to claim 1, further comprising:

a pointer memory part configured to store a pointer for specifying said inspection target page in each block, wherein said page specifying part specifies said inspection target page in said inspection target block from a pointer for said inspection target block by referring to said pointer memory part.

3. The memory access control apparatus according to claim 2, wherein after said specifying part specifies said inspection target page, said pointer for a corresponding block is incremented by one page.

4. The memory access control apparatus according to claim 3, wherein after the last page in said corresponding block is specified as an inspection target, said pointer is updated so that the first page in said corresponding block is next specified as an inspection target.

5. The memory access control apparatus according to claim 4, wherein said pointer for said corresponding block is reset to an initial position after all pages in said corresponding block are specified as said inspection target page by said specifying part.

6. The memory access control apparatus according to claim 4, wherein a read count for said inspection target block is reset to zero after all pages in said block are specified as said inspection target page by said specifying part.

7. The memory access control apparatus according to claim 1, wherein said specifying part specifies said inspection target page prior to execution of a read operation on said nonvolatile semiconductor memory.

8. The memory access control apparatus according to claim 1, wherein said specifying part specifies said inspection target page after completion of a read operation on said nonvolatile semiconductor memory and prior to execution of a next read operation.

9. The memory access control apparatus according to claim 1, wherein the maximum number of pages for each read operation is determined in advance with respect to said nonvolatile semiconductor memory, and said candidate specifying part specifies all blocks which can be accessed on the basis of an address specified in a read operation and said maximum number of pages.

10. The memory access control apparatus according to claim 1, wherein said read count memory counts up said read count from the time when said memory access control apparatus is powered on.

11. A memory access control method for controlling access to a rewritable nonvolatile semiconductor memory which is readable by page and erasable by block including a plurality of pages, comprising:

(a) storing a read count for said nonvolatile semiconductor memory by block;

(b) specifying an inspection target page after a read request to said nonvolatile semiconductor memory is issued; and (c) inspecting whether there is an error in said inspection target page, wherein the step (b) includes:

specifying all blocks which can be accessed based on an address specified by a read command, as candidate blocks;

specifying a block whose read count is the highest among said candidate blocks as an inspection target block by referring to a read count stored in the step (a); and specifying said inspection target page out of said inspection target block on the basis of a predetermined rule.

12. The memory access control method according to claim 11, further comprising:

(d) storing a pointer for specifying said inspection target page in each block, wherein the step of specifying said inspection target page out of said inspection target block includes specifying said inspection target page in said inspection target block from a pointer for said inspection target block by referring to a pointer stored in the step (d).

13. A memory access control apparatus for controlling access to a rewritable nonvolatile semiconductor memory which is readable by page and erasable by block including a plurality of pages, comprising:

a read count memory configured to store a read count for said nonvolatile semiconductor memory by block; and circuitry configured to:

specify an inspection target page after a read request to said nonvolatile semiconductor memory is issued;

inspect whether there is an error in said inspection target page;

specify all blocks which can be accessed based on an address specified by a read command, as candidate blocks;

specify a block whose read count is the highest among said candidate blocks as an inspection target block by referring to said read count memory; and specify said inspection target page out of said inspection target block on the basis of a predetermined rule.

* * * * *